United States Patent
Boonekamp et al.

(10) Patent No.: US 8,427,605 B2
(45) Date of Patent: Apr. 23, 2013

(54) ILLUMINATION DEVICE WITH ELECTRICAL VARIABLE SCATTERING ELEMENT

(75) Inventors: Eric Boonekamp, Utrecht (NL); Johannes P. M. Ansems, Hulsel (NL); Marco Van As, Waalre (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 229 days.

(21) Appl. No.: 13/120,168

(22) PCT Filed: Sep. 16, 2009

(86) PCT No.: PCT/IB2009/054049
§ 371 (c)(1),
(2), (4) Date: Mar. 22, 2011

(87) PCT Pub. No.: WO2010/035176
PCT Pub. Date: Apr. 1, 2010

(65) Prior Publication Data
US 2011/0176091 A1    Jul. 21, 2011

(30) Foreign Application Priority Data
Sep. 23, 2008 (EP) ..................... 08164912

(51) Int. Cl.
*G02F 1/1333* (2006.01)
*G02B 26/00* (2006.01)
*F21V 9/16* (2006.01)

(52) U.S. Cl.
USPC ............................... 349/86; 359/238; 362/84

(58) Field of Classification Search ............ 349/86; 359/238; 362/84
See application file for complete search history.

(56) References Cited

U.S. PATENT DOCUMENTS

| 6,016,038 | A  | 1/2000  | Mueller et al. |
| 2004/0233664 | A1 | 11/2004 | Beeson et al. |
| 2005/0269582 | A1 | 12/2005 | Mueller et al. |
| 2006/0072314 | A1 | 4/2006  | Rains |

(Continued)

FOREIGN PATENT DOCUMENTS

| EP | 1081771 A2 | 3/2001 |
| EP | 1441395 A2 | 7/2004 |

(Continued)

OTHER PUBLICATIONS

Narendran, "Improved performance white LED", 5th International Conference on Solid State Lighting, Proceedings of SPIE 5941, 45-50, Bellingham,WA, International Society of Optical Engineers, 2005.

*Primary Examiner* — Mike Qi
(74) *Attorney, Agent, or Firm* — Mark L. Beloborodov (57) ABSTRACT

The invention provides an illumination device (1), arranged to provide illumination device light (250). The illumination device (1) comprising a light chamber (100), an electrically variable scattering element (500), and a controller (600). The light chamber (100) contains a light emitting diode (10) (LED) arranged to emit LED light (20); comprises a luminescent material layer (200) arranged remote from the LED (10) and arranged to absorb at least part of the LED light (20) and emit luminescent material emission (220); and comprises an exit face (301), through which one or more of the LED light (20) and the luminescent material emission (220) may escape to the exterior (22) of the light chamber (100) thereby providing illumination device light (250). The electrically variable scattering element (500) is arranged downstream of the luminescent material layer (200) and upstream of the exit face (301). The controller (600) is electrically connected to the electrically variable scattering element (500) and arranged to control the scattering of the electrically variable scattering element (500). Such device may allow the possibility of color tuning and/or correlated color temperature tuning of the illumination device light.

12 Claims, 4 Drawing Sheets

U.S. PATENT DOCUMENTS

| | | |
|---|---|---|
| 2006/0202105 A1 | 9/2006 | Krames et al. |
| 2007/0058108 A1 | 3/2007 | Uehara et al. |
| 2007/0126017 A1 | 6/2007 | Krames et al. |
| 2007/0273265 A1 | 11/2007 | Hikmet |
| 2010/0328926 A1* | 12/2010 | Hoelen et al. .................. 362/84 |
| 2011/0176076 A1* | 7/2011 | Van Bommel et al. ......... 349/22 |

FOREIGN PATENT DOCUMENTS

| | | |
|---|---|---|
| WO | 8504262 A1 | 9/1985 |
| WO | 2005121641 A1 | 12/2005 |
| WO | 2006059265 A1 | 6/2006 |
| WO | 2006061753 A1 | 6/2006 |
| WO | 2006097868 A2 | 9/2006 |
| WO | 2006114726 A2 | 11/2006 |
| WO | 2007007220 A1 | 1/2007 |
| WO | 2007007235 A2 | 1/2007 |
| WO | 2007046035 A1 | 4/2007 |
| WO | 2007057830 A1 | 5/2007 |
| WO | 2007069142 A2 | 6/2007 |
| WO | 2007080555 A1 | 7/2007 |

* cited by examiner

ILLUMINATION DEVICE WITH ELECTRICAL VARIABLE SCATTERING ELEMENT

FIELD OF THE INVENTION

The invention relates to an illumination device comprising a chamber containing a light emitting diode (LED), and a luminescent material layer arranged remote from the LED. The invention further relates to the use of an electrical variable scattering element for use in such illumination device.

BACKGROUND OF THE INVENTION

Devices having a variable colour output are known in the art. US2007273265 for instance discloses a light emitting device with variable output colour. More specifically, this document describes a colour conversion cell which can be positioned in front of a light source in order to generate other colours or colour temperatures. Typically the light source is a light emitting diode (LED) which is power efficient but emits in a narrow and fixed spectra. The new colours are generated by photoluminescence in fluorescent dyes contained in the cell. The colour converting of the cell is electrically controllable, preferably by controlling the orientation, density or distribution of the fluorescent dyes, or by controlling a path length of the light in the cell.

Further, WO2007069142 describes a light-emitting device for emitting light having a desired colour point, comprising at least one solid-state light source, at least one light-converting element, a light guiding arrangement and a switch control unit, wherein the solid-state light source is provided for emitting primary radiation, the light guiding arrangement arranged between the solid-state light source and the light-converting element has at least one electro-optical switch for controllably splitting the primary radiation into a first portion and a second portion, the switch control unit is provided for controlling the electro-optical switch or switches for variably adjusting the ratio between the first and the second portion of the primary radiation, and the light-converting element is provided for the partial or complete absorption of at least a first portion of the primary radiation and for the re-emission of secondary radiation.

SUMMARY OF THE INVENTION

Disadvantages of prior art systems to tune the optical properties may be the use of relatively instable organic dyes, the complexity of the devices or the loss of device light the optical switches. Further, such devices may for instance not easily be used to provide a lighting device able to tune the correlated colour temperature of the device light.

Colour tuning is considered as a unique feature of light emitting diodes based luminaires. The use of e.g. a combination of "cool-white" or "warm-white" LEDs allows moving over a line close to the black body locus. These phosphor-based white LEDs can be combined in a light box consisting of a highly reflecting cavity and a diffuser covering an opening in the cavity. Tuning the colour is possible in these kinds of modules. However this leads to incomplete use of the installed LEDs and consequently higher costs. In addition, blue light conversion by a phosphor layer close to the LED die is not very efficient.

Hence, it is an aspect of the invention to provide an alternative illumination device, which preferably further at least partly obviates one or more of above-described drawbacks.

In a first aspect, the invention provides an illumination device, arranged to provide illumination device light (also indicated as "device light"), the illumination device comprising a light chamber, an electrically variable scattering element, and a controller, wherein a. the light chamber contains a light emitting diode (LED) arranged to emit LED light, comprises a luminescent material layer arranged remote from the LED and arranged to absorb at least part of the LED light and emit luminescent material emission, and comprises an exit face, through which one or more of the LED light and the luminescent material emission may escape to the exterior of the light chamber thereby providing illumination device light;

b. the electrically variable scattering element is arranged downstream of the luminescent material layer and upstream of the exit face; and c. the controller is electrically connected to the electrically variable scattering element and arranged to control the scattering of the electrically variable scattering element.

Advantageously, such device may allow the possibility of colour tuning and/or correlated colour temperature tuning of the illumination device light, since the electrically variable scattering element may be used to scatter back (i.e. in an upstream direction) part of the light (especially the LED light) back to the luminescent material, which may lead to further absorption and a relative increase of the luminescent material emission. In this way, the colour point and correlated colour temperature (CCT) may be varied as function of the scattering. This may advantageously lead to an illumination device that also allows dimming substantially along the black body locus, something that is for instance hardly possible with conventional low pressure luminescent lamps.

Hence, warm and cold light may be produced by controlling the electrically variable scattering element, depending upon the wishes of the user and/or depending upon predefined parameters.

Advantageously, the illumination device may be arranged such that the LED and/or the luminescent material, especially the luminescent material, are substantially invisible by an observer (which is external from the illumination device (i.e. downstream of the exit face)) when the illumination device is in the "off state". By switching the electrically variable scattering element in a substantial scattering mode, it may be prevented that an observer observes the luminescent material. This may be desired by users. Hence, the electrically variable scattering element preferably has a substantially non-transmissive state, and when the LED is in a non-emitting state, the electrically variable scattering element is in said substantially non-transmissive state.

In an embodiment, the light emitting diode (LED) is arranged to emit blue light as LED light and the luminescent material layer comprises one or more of (a) yellow light emitting luminescent material (able to absorb at least part of the blue LED light) and optionally a red light emitting luminescent material (able to absorb at least part of the blue LED light and/or at least part of the yellow emission) and (b) a green light emitting luminescent material (able to absorb at least part of the blue LED light) and a red light emitting luminescent material (able to absorb at least part of the blue LED light and/or at least part of the green emission). However, also a combination of yellow and green and red emitting luminescent materials might be possible. In this way, white light may be provided.

In yet another embodiment, the light emitting diode (LED) is arranged to emit UV light as LED light and the luminescent material layer comprises one or more of (a) blue emitting material (able to absorb at least part of the UV LED light) and yellow light emitting luminescent material (able to absorb at least part of the UV LED light and/or at least part of the blue emission) and optionally a red light emitting luminescent material (able to absorb at least part of the UV LED light and/or at least part of the blue emission and/or at least part of the yellow emission) and (b) a blue emitting material (able to absorb at least part of the UV LED light), a green light emitting luminescent material (able to absorb at least part of the UV LED light and/or at least part of the blue emission) and a red light emitting luminescent material (able to absorb at least part of the UV LED light and/or at least part of the blue emission and/or at least part of the green emission). In this way, also white light may be provided.

Although the illumination device may be arranged to provide any type of visible light, in a preferred embodiment, the illumination device is arranged to provide white light (preferably of different types, such as warm or cool white light).

Some luminescent materials, such as the halophosphates, may emit substantially different colours within the visible spectrum. Hence, instead of two or more luminescent materials emitting substantially different colours, also (a) luminescent material(s) that emit two or more colours may be applied. Another example thereof is yttrium aluminium garnet (YAG) (or corresponding garnets) that are doped with cerium and praseodymium.

Although the illumination device may be arranged to provide any type of visible light, in a preferred embodiment, the illumination device is arranged to provide white light (preferably of different types, such as warm or cool white light).

In an embodiment, the illumination device comprises a plurality of light emitting diodes (LEDs) arranged to emit LED emission, such as in the order of 2-100, like 4-64. The term LED may include in an embodiment a plurality of LEDs.

The term white light (such as illumination device light) herein, is known to the person skilled in the art. It especially relates to light having a correlated colour temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of colour matching) from the BBL, especially within about 10 SDCM from the BBL, even more especially within about 5 SDCM from the BBL. The term "predetermined colour" may relate to any colour within the colour triangle, but may especially refer to white light.

The terms "blue light" or "blue emission" especially relates to light having a wavelength in the range of about 410-490 nm. The term "green light" especially relates to light having a wavelength in the range of about 500-570 nm. The term "red light" especially relates to light having a wavelength in the range of about 590-650 nm. The term "yellow light" especially relates to light having a wavelength in the range of about 560-590 nm. The term "light" herein especially relates to visible light, i.e. light having a wavelength selected from the range of about 380-780 nm.

These terms do not exclude that especially the luminescent material may have a broad band emission having emission with wavelength(s) outside the range of for instance about 500-570 nm, about 590-650 nm, and about 560-590 nm, respectively. However, the dominant wavelength of emissions of such luminescent materials (or of the LED, respectively) will be found within the herein given ranges, respectively. Hence, the phrase "with a wavelength in the range of" especially indicates that the emission may have a dominant emission wavelength within the specified range.

Especially preferred luminescent materials may be selected from garnets and nitrides, especially doped with trivalent cerium or divalent europium, respectively. Embodiments of garnets especially include $A_3B_5O_{12}$ garnets, wherein A comprises at least yttrium or lutetium and wherein B comprises at least aluminium. Such garnet may be doped with cerium (Ce), with praseodymium (Pr) or a combination of cerium and praseodymium; especially however with Ce. Especially, B comprises aluminium (Al), however, B may also partly comprise gallium (Ga) and/or scandium (Sc) and/or indium (In), especially up to about 20% of B, more especially up to about 10% of B (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1.

The term ":Ce", indicates that part of the metal ions (i.e. in the garnets: part of the "A" ions) in the luminescent material is replaced by Ce. For instance, assuming $(Y_{1-x}Lu_x)_3Al_5O_{12}$:Ce, part of Y and/or Lu is replaced by Ce. This notation is known to the person skilled in the art. Ce will replace A in general for not more than 10%; in general, the Ce concentration will be in the range of 0.1-4%, especially 0.1-2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art.

The red luminescent material may in an embodiment comprise one or more materials selected from the group consisting of $(Ba,Sr,Ca)S$:Eu, $(Ba,Sr,Ca)AlSiN_3$:Eu and $(Ba,Sr,Ca)_2Si_5N_8$:Eu. In these compounds, europium (Eu) is substantially or only divalent, and replaces one or more of the indicated divalent cations. In general, Eu will not be present in amounts larger than 10% of the cation, especially in the range of about 0.5-10, more especially in the range of about 0.5-5% relative to the cation(s) it replaces. The term ":Eu", indicates that part of the metal ions is replaced by Eu (in these examples by $Eu^{2+}$). For instance, assuming 2% Eu in $CaAlSiN_3$:Eu, the correct formula could be $(Ca_{0.98}Eu_{0.02})AlSiN_3$. Divalent europium will in general replace divalent cations, such as the above divalent alkaline earth cations, especially Ca, Sr or Ba.

The material $(Ba,Sr,Ca)S$:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Further, the material $(Ba,Sr,Ca)_2Si_5N_8$:Eu can also be indicated as $M_2Si_5N_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50-100%, especially 50-90% Ba and 50-0%, especially 50-10% Sr, such as $Ba_{1.5}Sr_{0.5}Si_5N_8$:Eu (i.e. 75% Ba; 25% Sr). Here, Eu is introduced and replaces at least part of M i.e. one or more of Ba, Sr, and Ca).

Likewise, the material $(Ba,Sr,Ca)AlSiN_3$:Eu can also be indicated as $MAlSiN_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

The term luminescent material herein especially relates to inorganic luminescent materials, which are also sometimes indicated as luminescent materials. These terms are known to the person skilled in the art.

The luminescent material may be comprised in a layer on the wall(s) of the chamber, in and/or on a transmissive ceramic material, in and/or on a transmissive glass, or may be comprised in and/or on a transmissive organic support. The transmissive supports, such as the transmissive ceramic material, the transmissive glass, and the transmissive organic support, may especially be arranged for embodiments, wherein the illumination device is arranged to provide LED light to the exterior via such transmissive support.

The term "layer" may comprise one or more layers. Thus, the term layer may also be interpreted in an embodiment as a plurality of layers. Layers may for instance be arranged adjacent, non-adjacent or on top of each other. A layer may in an embodiment be coated on a part of the chamber, such as a wall and/or the bottom, but such wall or bottom may also be partly coated with such layer.

As mentioned above, the transmissive support may comprise at least part of the luminescent material. The fact that the transmissive support comprises the luminescent material does not exclude that part of the luminescent material may be arranged elsewhere in the illumination device; however, in a specific embodiment, substantially all luminescent material is comprised by the transmissive support. The phrase "the transmissive support comprises the luminescent material" may relate to a transmissive support selected from the group consisting of a transmissive support wherein the luminescent material is embedded in the transmissive support, a transmissive support that is luminescent material itself, a transmissive support having a downstream coating comprising the luminescent material (side directed to the exterior), a transmissive support having an upstream coating comprising the luminescent material (side facing the LED(s), and a transmissive support comprising both an upstream and downstream coating comprising the luminescent material.

In an embodiment, the transmissive support has an upstream face comprising the coating, wherein the coating comprises at least part of the luminescent material. Such embodiment both benefits from the remote position of the luminescent material (i.e. remote from the LED) and from a relative remote position from the exit window.

In a specific embodiment, at least part of the luminescent material comprises a transmissive ceramic luminescent material, wherein the transmissive support comprises the transmissive ceramic luminescent material. Hence, in this embodiment, the transmissive support is a luminescent ceramic. Especially suitable luminescent ceramics are based on cerium containing garnets, as described above. Transmissive ceramic layers or luminescent ceramics, and their method of preparation, are known in the art. It is for instance referred to U.S. patent application Ser. No. 10/861,172 (US2005/0269582), to U.S. patent application Ser. No. 11/080,801 (US2006/0202105), or to WO2006/097868, to WO2007/080555, to US2007/0126017 and to WO2006/114726. The documents, and especially the information about the preparation of the ceramic layers provided in these documents, are herein incorporated by reference.

In yet another embodiment, the transmissive support comprises an organic material, such as a foil or sheet. Hence, in an embodiment, the luminescent material layer comprises a transmissive organic material support selected from the group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), polycarbonate, polyvinylchloride (PVC), polyethyleneterephthalate (PET), (PETG) (glycol modified polyethyleneterephthalate), PDMS (polydimethylsiloxane), and COC (cyclo olefin copolymer).

However, in another embodiment the transmissive support comprises an inorganic material. Preferred inorganic materials are selected from the group consisting of glasses, (fused) quartz, ceramic materials (see above), and silicones.

As mentioned above, the luminescent material may be arranged within and/or on the transmissive support.

The term "transmissive" herein indicates that something is permeable to light, especially to parts of the visible wavelength region, more especially, substantially for the entire visible region (i.e. 380-780 nm). In general, the term transmissive herein indicates that all or part of the visible light is permitted to pass at least partly through (the material), with or without being diffused. Especially, the term "transmissive" may indicate that a 1 cm thick piece (such as a 1*1*1 cm cube) under perpendicular radiation with (visible) light transmits at a predefined wavelength selected from the (visible) light at least about 50%, preferably at least about 80%, even more preferably at least about 90%, yet even more preferably at least about 95% of the light at that predefined wavelength.

Remote luminescent material in LED based light sources seems to be very advantageous with respect to system efficacy, in particular for generation of light with a low colour temperature (warm white). Applying a luminescent material coating on a transmissive support (or elsewhere remote from the LED) may result in high system efficacy because only little light may be reflected back into the LED where it has a rather high chance of being absorbed. Using the luminescent material remote from the LEDs can result in efficacy gains up to about 50% compared to systems with luminescent material in the LED package. Hence, the present invention applies a light chamber, with the luminescent material layer(s) remote from the LED. Remote systems, wherein the luminescent material is remote from the light source, are for instance described in WO2007046035 or by Narendran, SPIE 2005, "Improved performance white LED", $5^{th}$ International Conference on Solid State Lighting, Proceedings of SPIE 5941, 45-50, Bellingham, Wash., International Society of Optical Engineers.

The arrangement of a transmissive support comprising the luminescent material instead of arranging the luminescent material to the LED allows a non-zero distance between the luminescent material and the LED. This distance is herein indicated as dLL (luminescent material LED distance). Distance dLL is especially a shortest distance. This means that in an embodiment, any shortest distance between the LED and the luminescent material is equal to or especially larger than 0 mm. In an embodiment the luminescent material LED distance (dLL) is in the range of 0.5-50 mm, especially in the range of 3-20 mm.

The illumination device may comprise more than one transmissive supports, with one or more of such transmissive supports comprising luminescent material. The more than one transmissive supports may for instance comprise different luminescent materials.

As mentioned above, the luminescent material layer may in embodiments or may in other embodiments not be comprised by part of the wall(s) of the light chamber. Those parts of the wall(s) (including bottom) not comprising the luminescent material layer(s) are preferably reflective, and may for instance comprise a reflective coating. For instance MCPET (microcellular polyethylene terephthalate) may be applied as reflective material. In this way, good mixing of the LED light and the luminescent material emission may be obtained.

The electrical variable scattering element may be any element that can be electrically switched between an at least partly transmissive state and an at least partly scattering state. Such systems are for instance described in WO2007/007220, US2007/0273265, and WO2007/007235, which are incorporated herein by reference. Suitable systems may be selected from for instance the group consisting of liquid crystals, cholesteric liquid crystals, polymer mixtures and especially polymer dispersed liquid crystals (PDLC). Hence, in a specific embodiment, the electrically variable scattering element comprises polymer dispersed liquid crystal (PDLC).

Such system can be scattering in the off state or in the on state, depending upon the type of polymer dispersed liquid crystal. Preferably, those types are selected, that are scattering in the off state.

Electrically controllable scattering can be obtained in various ways. The most known materials, which can be used for this purpose, are the polymer dispersed liquid crystal, gels and cholesteric texture. PDLC is obtained when liquid crystal molecules are dispersed in an isotropic polymer. In the field off state liquid crystal molecules are oriented randomly in the polymeric matrix and the light is scattered randomly in all directions. Upon application of an electric field the scattering gradually decreases and when the liquid crystal molecules become totally aligned in the direction of the electric field the ordinary refractive index of the molecules match the refractive index of the polymer so the cell becomes transparent. In the case of the gels giving polarisation independent scattering, liquid crystals with negative dielectric anisotropy dispersed in an oriented anisotropic polymer matrix are preferably used. In the field off state the anisotropic network is oriented within the LC therefore there is no refractive index fluctuations within the cell so that the cell appears to be transparent. Upon applying an electric field across the gel the molecules tend to become oriented perpendicular to the applied field creating domains with various LC orientations causing scattering of light.

In the case of cholesteric texture surface treatment or polymer is used in order to induce the so-called focal conic texture in the liquid crystal which shows strong scattering of light. Upon application of an electric field liquid crystal molecules become aligned in the direction of the field and the scattering texture disappears.

As mentioned above, the electrical variable scattering element, such as the polymer dispersed liquid crystal, is arranged downstream of the luminescent material layer.

The electrical variable scattering element (in the off-state) may in an embodiment have a white colour or may in another embodiment have another colour (for instance due to the presence of a dye in the electrical variable scattering element).

The terms "upstream" and "downstream" relate to an arrangement of items or features relative to the propagation of the light from the light source (here the LED), wherein relative to a first position within a beam of light from the light source, a second position in the beam of light closer to the light source is "upstream", and a third position within the beam of light further away from the light source is "downstream".

In an embodiment, the exit window may comprise the electrically variable scattering element, but the electrically variable scattering element may optionally or additionally also be arranged within the light chamber (see also below).

In an embodiment, the illumination device may further comprise a sensor arranged to sense one or more optical properties from the illumination device light and arranged to provide a corresponding sensor signal, wherein the controller is further arranged to control electrically variable scattering element in response to the sensor signal. In this way, the controller may be used to tune the device light of the illumination device to the desired colour point and/or correlated colour temperature, in response to the sensor signal.

In a further embodiment, the illumination device may comprise a plurality of electrically variable scattering elements. Such embodiment may especially be used in combination with a plurality of chambers and/or a plurality of luminescent material layers. In this way, the colour point and/or correlated colour can even more easily be tuned. Hence, in a specific embodiment, the illumination device may comprise a plurality of luminescent material layers. To even further allow tuning of the optical properties of the device light, two or more of the plurality of luminescent material layers may have different emission characteristics. Therefore, in a specific embodiment, a first luminescent material layer and a second luminescent material layer may emit luminescent material emissions having different colour points, and especially different correlated colour temperatures. As will be clear to the person skilled in the art, further luminescent material layers may be present, which may optionally all have different colour points, and especially different correlated colour temperatures. This may allow a larger colour gamut and/or a broader tuning along the BBL of the illumination device light. For the sake of simplicity, herein only embodiments with such first luminescent material layer and second luminescent material layer, etc., are further discussed.

Especially, a first electrically variable scattering element is arranged downstream of the first luminescent material layer, and a second electrically variable scattering element is arranged downstream of the second luminescent material layer. Likewise, further electrically variable scattering elements arranged downstream of the further luminescent material layer, respectively, may be comprised by the illumination device. Especially, each electrically variable scattering element is arranged to be able to scatter, depending upon the set scattering, part of the light, especially the LED light, back to the respective luminescent material layer (in the chamber), thereby allowing further conversion of LED light into luminescent material emission, respectively.

In an embodiment, the illumination device may comprise a plurality of light chambers, comprising a plurality of electrically variable scattering elements and a plurality of luminescent material layers, respectively. In this way, each light chamber may provide luminescent material emission of specific optical properties. Preferably, there is one single exit face to the exterior, i.e. substantially all light provided by the chambers can only escape to the exterior via the exit face.

In yet a further aspect, the invention provides the use of an electrically variable scattering element in an illumination device comprising a light chamber, wherein a. the light chamber contains a light emitting diode (LED) arranged to emit LED light; comprises a luminescent material layer arranged remote from the LED and arranged to absorb at least part of the LED light and emit luminescent material emission; and comprises an exit face, through which one or more of the LED light and the luminescent material emission may escape to the exterior of the light chamber thereby providing illumination device light;

b. the electrically variable scattering element is arranged downstream of the luminescent material layer and upstream of the exit face; and to reflect part of one or more of the LED light and luminescent material emission back to the luminescent material layer.

Such electrically variable scattering element may especially be used for controlling the one or more optical properties selected from the group consisting of the colour point and the correlated colour temperature of the illumination device light generated by the illumination device.

As mentioned above, the electrically variable scattering element preferably comprises a substantially non-transmissive state, and the electrically variable scattering element may therefore especially be used to impede visibility of one or more of the (coloured) luminescent material layer and the LED from the exterior, when the LED is switched off.

BRIEF DESCRIPTION OF THE DRAWINGS

Embodiments of the invention will now be described, by way of example only, with reference to the accompanying schematic drawings in which corresponding reference symbols indicate corresponding parts, and in which.

DESCRIPTION OF PREFERRED EMBODIMENTS

Figure 1:
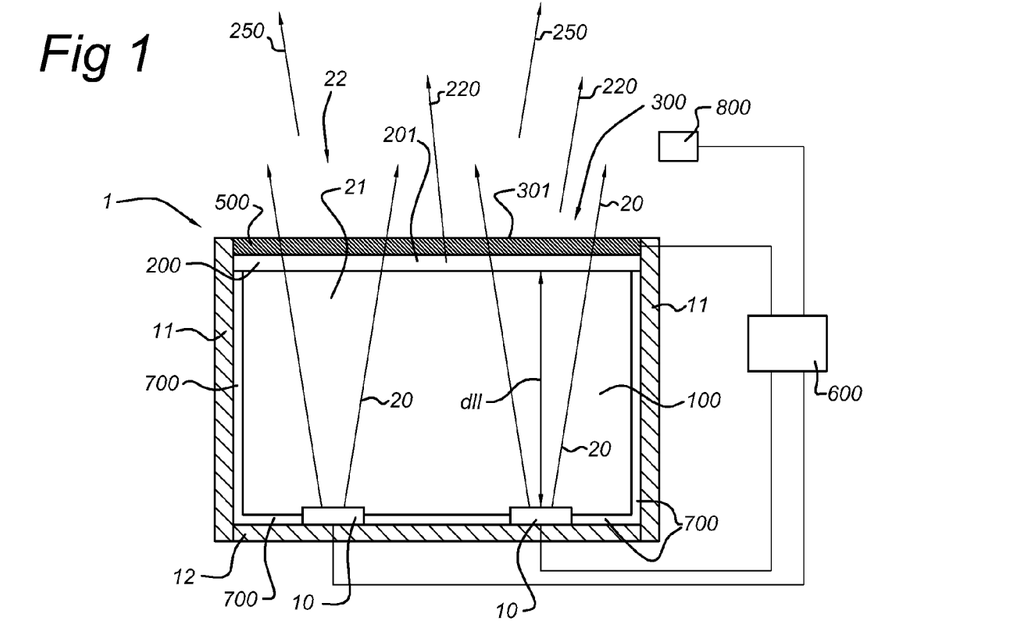
FIG. 1 schematically depicts an embodiment of the illumination device according to the invention.

FIG. 1 schematically depicts an embodiment of an illumination device of the invention. The illumination device is indicated with reference 1; the illumination device light generated by the illumination device 1 in use is indicated with reference 250.

The illumination device 1 comprises a light chamber 100, an electrically variable scattering element 500, and a controller 600. The latter may be integrated into the illumination device 1 or may be arranged external from the device 1. The light chamber 100 is a cavity or chamber, which contains a light emitting diode 10, which in use emits LED light 20. The light chamber further comprises a luminescent material layer 200, which is arranged remote from the LED 10. The luminescent material layer comprise luminescent material 201. This luminescent material layer 200, or more especially the luminescent material 201, is able to absorb at least part of the LED light 20 and emit luminescent material emission, which is indicated with reference 220. The LED light 20 and/or the luminescent material emission 220 may escape from the chamber 100 through an exit face 301, here part of a window 300. Such exit window 300 may be a diffuser; however, the electrically variable scattering element 500 may also be arranged as exit window 300. Here, the illumination device 1 comprises a single exit face 301, but more than 1 exit face 301 may be present. The light escaping from the light chamber 100 escapes to the exterior of the illumination device 1, which exterior is indicated with reference 22.

By way of example, 2 LEDs 10 are depicted, but only 1 LED, or a plurality of LEDs, such as 4 or 10, 16 or 100, etc. may be applied.

In principle, depending upon the type of luminescent material 201, the amount thereof, and the arrangement of the illumination device 1, all LED light 20 might be converted into luminescent material emission 220. This implies that when light from the light chamber 100 escapes to the exterior, the illumination device light 250 substantially consists of luminescent material light. For producing white light with a blue LED, both luminescent material emission 220 and LED light 20 will be used to provide illumination device light 250 being white.

The electrically variable scattering element 500 is arranged downstream of the luminescent material layer 200 and upstream of the exit face 301. This means that when the electrically variable scattering element 500 would be in a complete scattering state, less or no luminescent material emission 220 might escape to the exterior 22. Here, the electrically variable scattering element 500 is drawn as an optical element that has to be passed by the luminescent material light 220 to escape to the exterior (via (here also exit window 300 and) exit face 301.

In FIG. 1, the electrically variable scattering element 500 is downstream of the luminescent material layer 200 and upstream of the exit face 301 since light 20 from the LED 10 may impinge on the luminescent material layer 200 and reflected light and/or luminescent material emission 220 from the luminescent material layer 200 subsequently may (partly) pass the electrically variable scattering element 500 in the direction of the exterior 22 through exit face 301. The interior of the light chamber 100 is also indicated with reference 21.

Note that in this and other embodiments, the term "exit face" indicates the face through which light from the light chamber 100 may escape from the light chamber 100; this does however not exclude the optional presence of further optical elements downstream of the exit face 22, such as collimators, colour filters, louvers, etc. (which are not depicted for the sake of understanding).

In another embodiment, not depicted, also only part of the luminescent material emission 220 may be intercepted downstream with the electrically variable scattering element 500 and part of the luminescent material light 220 might also escape to the exterior 22 being "unhindered" by the luminescent material light 220. Note that the electrically variable scattering element 500 may also comprise a plurality of electrically variable scattering element 500, arranged parallel, with or without spaces between adjacent electrically variable scattering elements 500.

Here, the luminescent material layer 200 is adjacent and substantially in contact with the electrically variable scattering element 500, such as a PDLC. Other configurations are also possible (see some examples below). The walls 11 and bottom 12 are preferably provided with a reflective material, such as a reflective coating comprising MCPET. The reflective coating is indicated with reference 700.

Further, the illumination device 1 may comprise (an internal or external) controller 600 which is electrically connected to the electrically variable scattering element 500. This controller 600 is arranged to control the scattering of the electrically variable scattering element 500. Here, in the embodiment schematically depicted, but also in general, the controller 600 may also be electrically connected to a sensor 800, arranged to measure one or more optical properties, such as colour point and/or correlated colour temperature of the device light 250, and arranged to generate a corresponding sensor signal, and/or electrically connected to the LED(s) 10. With the latter option, also the intensity of the LED 10 may be controlled by controller 600.

The illumination device 1 may further comprise a user interface (not depicted). The user interface may electrically be connected to the controller 600. The user interface or user input device ("local" or "remote") controls the lighting generated by the illumination device 1 as selected by the user. The interface or input device may comprise control action buttons shown in an intuitive way, how the end user can navigate along the available settings. An intelligent microprocessor may allow a user to generate dynamic light effects via an algorithm. The user interface may comprise a remote control unit.

Optionally, the sensor 600 may be arranged to measure (bio)physical input parameters, to record audio and video signals, to measure lighting conditions, etc. The term sensor may also indicate a plurality of sensors. Intelligent (bio) physical input parameters and/or audio/video monitoring, can be used to automatically translate someone's behaviour (motion, voice, music selected, facial expression) or activities (waking up, reading, falling asleep) into a certain setting of the lighting device or its dynamic lighting effect. Various possibilities exist, which are non-limitedly summarized below.

To detect the users mood/emotion one or more sensors 600 can be applied as separate devices and/or combined within the user interface. Alternatively, video/audio recordings can be used to detect voice and/or facial expression (smiling, sad, laughing, open/closed eyes, waking up, drowsy, sleepy).

Figure 2:
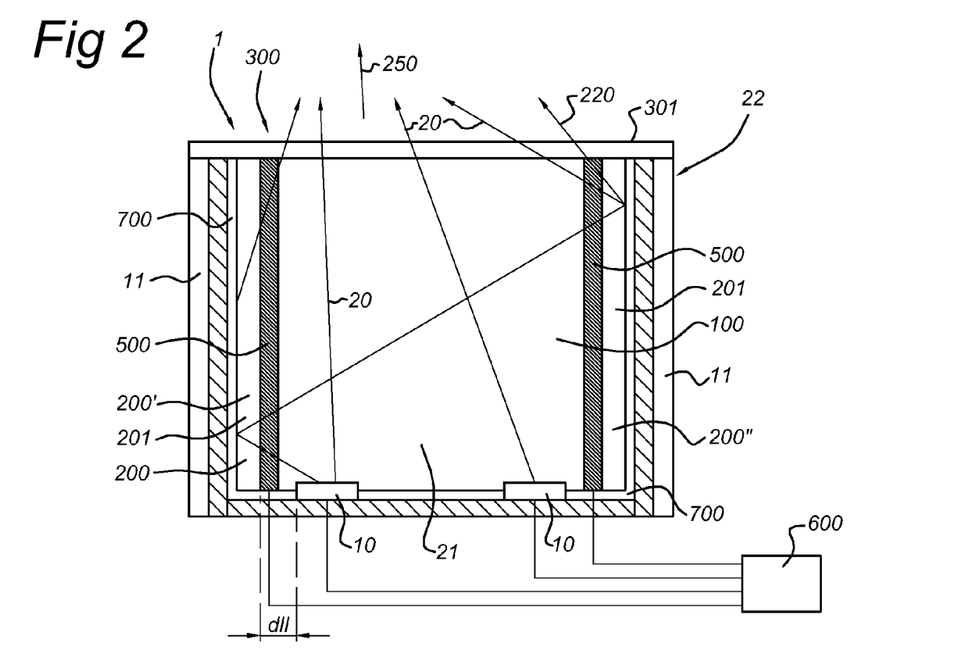
FIG. 2 schematically depicts another embodiment of the illumination device according to the invention.

FIG. 2 schematically depicts another embodiment. Here, the illumination device 1 comprises at least two luminescent material layers 200, and at least two electrically variable scattering elements 500, respectively. A first luminescent material layer 200 is indicated with reference 200' and a second luminescent material layer 200 is indicated with reference 200". Likewise, a first electrically variable scattering element 500 is indicated with reference 500' and a second electrically variable scattering element 500 is indicated with reference 200". The first electrically variable scattering element 500' is upstream of the first luminescent material layer 200'; the second electrically variable scattering element 500" is upstream of the second luminescent material layer 200". Note however that in this configuration the LED light 20 first has to travel through the electrically variable scattering element 500, then excite the luminescent material 201 in the luminescent material layer 200, and then the LED light 20 and/or the luminescent material emission 220 may be transmitted through the electrically variable scattering element 500. Hence, in this schematically depicted embodiment, the electrically variable scattering elements 500 are arranged in such a way, that they are in fact arranged both upstream and downstream of the luminescent material layers 200 at the same time, respectively.

In this embodiment, the walls 11 may be covered with (two or more different) luminescent material(s) 201. Especially the use of luminescent material layers 200 comprising different type of luminescent materials 201, allows the embodiment schematically depicted to control the intensity of the emission of first luminescent material layer 200', and to control the intensity of the emission of second luminescent material layer 200", and assuming luminescent material layers 200 comprising luminescent materials 201 at different wavelengths (or wavelength ranges), the colour and correlated colour temperature of the illumination device light 250 may be controlled.

The exit window 300, with exit face 301, may be transparent or translucent, and may comprise one of the above described materials for transmissive supports.

The electrically variable scattering elements 500 may be arranged to substantially fully cover the luminescent material layers 200, thereby allowing "invisibility" of the luminescent material layers 200 to an external observer when the LEDs 10 are switched off and when the electrically variable scattering element 500 are switched in a substantially scattering state.

An advantage of the embodiment schematically depicted in FIG. 2 may be the possibility to control the colour point and or colour temperature of the illumination device light 250. For instance, the first luminescent material layer 200' may comprise a warm white light emitting luminescent material and the second luminescent material layer 200" may comprise a cool white light emitting luminescent material. FIGS. 3a-3b and 4a-4b schematically depict other embodiments that may also provide this advantage.

Figure 3A:
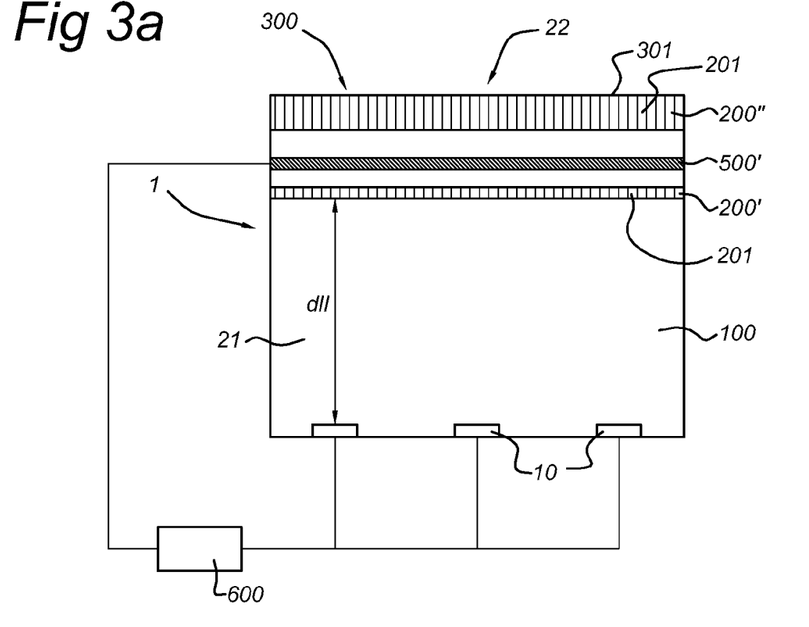
FIGS. 3a-3b schematically depict a number of embodiments of the illumination device according to the invention.
Figure 3B:
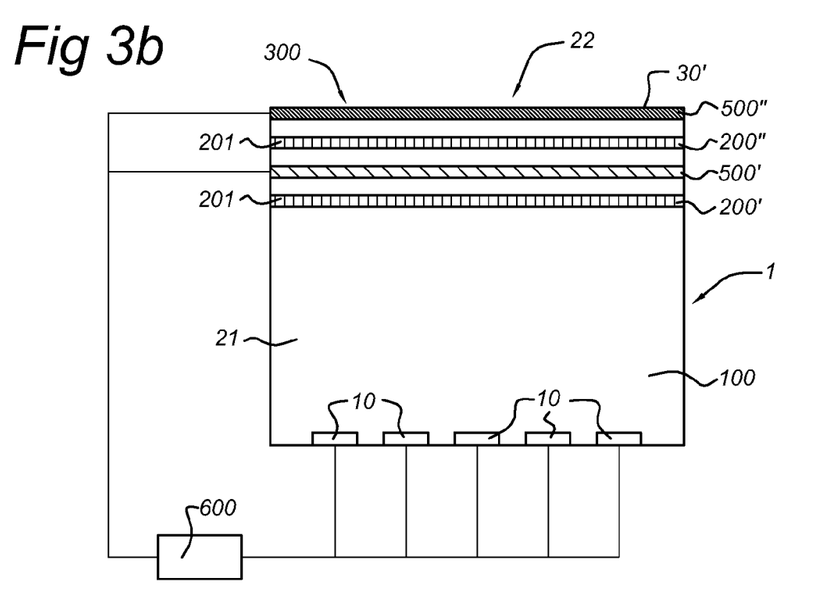

FIGS. 3a and 3b schematically depict illumination devices 1 comprising a plurality of luminescent material layers 200, indicated again by way of example with first luminescent material layer 200' and second luminescent material layer 200" (although of course more luminescent material layers might be present) and one (FIG. 3a) or a plurality of electrically variable scattering element 500 (FIG. 3b), respectively. In the latter Figure, again the plurality of electrically variable scattering elements 500, is indicated by way of example with first electrically variable scattering element 500' and second electrically variable scattering element 500" (although of course more electrically variable scattering element might be present).

In FIG. 3a, the first luminescent material layer 200' is upstream of the (first) electrically variable scattering element 500', which is on its turn upstream of the second luminescent material layer 200", but downstream of the first luminescent material layer 200'. In this way, the throughput of LED light 20 and/or the emission of the first luminescent material layer 200' can be controlled, and to a certain extend thereby also the emission of the second luminescent material layer 200" (since this emission may be dependent upon the amount of LED light 20). In this embodiment, the second luminescent material layer 200", which may for instance be a luminescent ceramic material, is used as exit window 300. For the sake of clarity, not all emissions and rays are drawn in this schematic Figure.

In contrast to FIG. 3a, FIG. 3b schematically depicts an embodiment wherein downstream of the second luminescent material layer 200", also an electrically variable scattering element is arranged, indicated again as second electrically variable scattering element 500". In this way, also via this second electrically variable scattering element 500" the emission of the second luminescent material layer 200" may be controlled, although this second electrically variable scattering element 500" may of course also have impact on the transmission of the LED light 20 and/or the luminescent material layer light 220 of the first luminescent material layer 200". For the sake of clarity, not all emissions and rays are drawn in this schematic Figure.

Figure 4A:
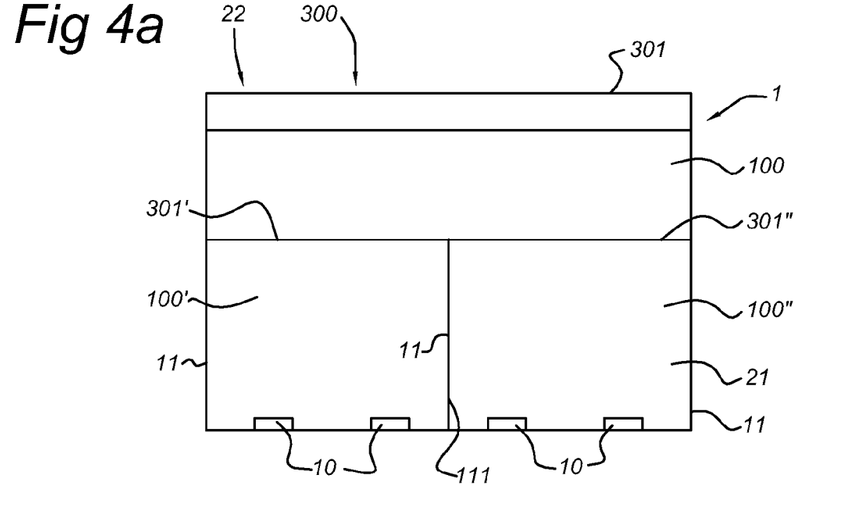
FIGS. 4a-4b schematically depict a number of embodiments of the illumination device according to the invention, with a plurality of light chamber.
Figure 4B:
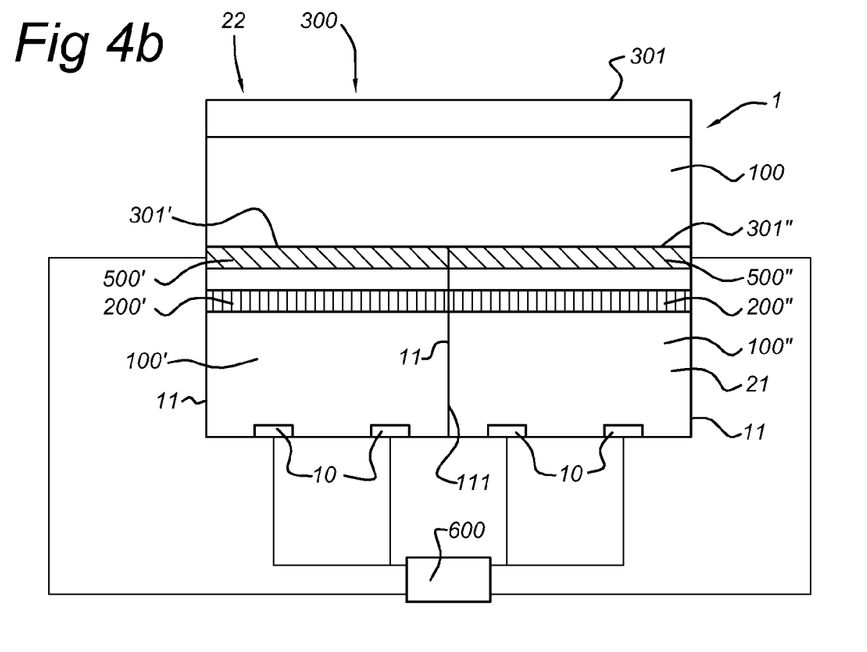

FIG. 4a, and FIG. 4b in more detail, schematically depict an embodiment wherein the illumination device 1 comprises a plurality of chambers 100. The main chamber, here indicated with reference 100, may be used to mix the colours (as it may also be used in the above described embodiments), whereas the "affiliate" chambers, indicated by way of example with first light chamber 100' and second light chamber 100", respectively, may be used to generate light with different colour points, respectively. Reference 111 indicates a reflective wall, separating the chambers 100' and 100". Of course, also a third chamber etc. may be indicated.

The notations 100',100", . . . , 500',500", . . . , and 200',200", . . . , indicate that two or more light chambers 100, two ore electrically variable scattering elements 500 and two or more luminescent material layers (200',200", . . . ) may be comprised by the illumination device 1, respectively.

The exit window 300, with exit face 301, may be transparent or translucent, and may be one of the above described materials for transmissive supports.

FIG. 4b schematically depicts an embodiment with which the illumination device may be able to have a controlled colour point (and correlated colour temperature). Here, the illumination device comprises a plurality of light chamber (100',100", . . . ), comprising a plurality of electrically variable scattering elements (500',500", . . . ) and a plurality of luminescent material layers (200',200", . . . ), respectively. For the sake of simplicity, only two of such chambers are drawn. The first electrically variable scattering element 500' may control the throughput and thus colour of the light escaping from the first chamber 100' to the main chamber 100; likewise, the second electrically variable scattering element 500" may control the throughput and thus colour of the light escaping from the second chamber 100" to the main chamber 100. Controlling of the colours of the individual chambers of the plurality of chambers may be performed as described above, for instance in relation to FIG. 1.

Note that the plurality of chambers, as depicted in FIGS. 4a and 4b, may also comprise chambers 100 as schematically depicted in FIG. 2.

Figure 5:
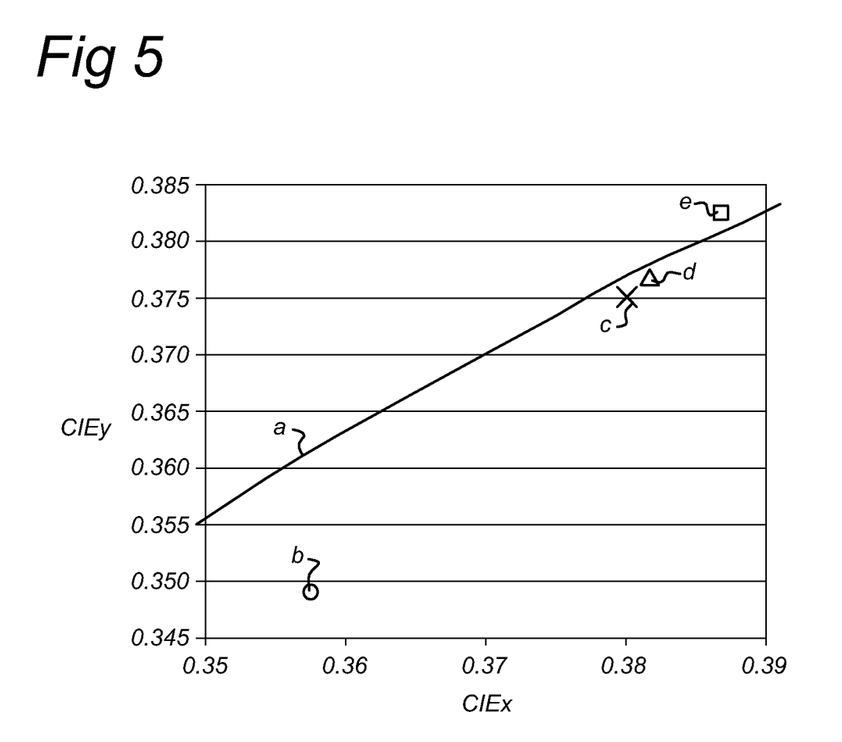
FIG. 5 schematically depicts the measured colour point shift by using different diffusing (scattering) levels of a diffuser.

FIG. 5 depicts an example of the colour point of the illumination device light 250 as function of the transmission through a diffuser as exit window 300, such as the herein described electrically variable scattering element 500, as function of the reflection. The solid line "a" indicates the black body locus (BBL). Reference point "b" indicates a fully transparent exit window 300. Points "c", "d" and "e", indicate the colour point for 50, 65 and 70% transmission, respectively (and thus 50, 35 and 30% reflection back in the chamber 100).

In a specific embodiment, instead of or in addition to the LED, conventional light sources such as (small) GLS lamps may be applied. Further, also combinations of blue and UV LEDs and accompanying luminescent material may be applied.

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. An illumination device, arranged to provide illumination device light, the illumination device comprising a light chamber, an electrically variable scattering element, and a controller, wherein the light chamber contains a light emitting diode (LED) arranged to emit LED light; comprises a luminescent material layer arranged remote from the LED and arranged to absorb at least part of the LED light and emit luminescent material emission; and comprises an exit face, through which one or more of the LED light and the luminescent material emission reaches to the exterior of the light chamber thereby providing illumination device light;

the electrically variable scattering element is arranged downstream of the luminescent material layer and upstream of the exit face; and the controller is electrically connected to the electrically variable scattering element and arranged to control the scattering of the electrically variable scattering element.

2. The illumination device according to claim 1, wherein the luminescent material layer comprises a transmissive ceramic layer.

3. The illumination device according to claim 1, wherein the luminescent material layer comprises a transmissive organic material support selected from the group consisting of PE (polyethylene), PP (polypropylene), PEN (polyethylene napthalate), PC (polycarbonate), polymethylacrylate (PMA), polymethylmethacrylate (PMMA), cellulose acetate butyrate (CAB), polycarbonate, polyvinylchloride (PVC), polyethyleneterephthalate (PET), (PETG) (glycol modified polyethylene terephthalate), PDMS (polydimethylsiloxane), and COC (cycloolefin copolymer).

4. The illumination device according to claim 1, wherein the electrically variable scattering element comprises polymer dispersed liquid crystal (PDLC).

5. The illumination device according to claim 1, wherein the electrically variable scattering element has a substantially non-transmissive state, and when the LED is in a non-emitting state, the electrically variable scattering element is in said substantially non-transmissive state.

6. The illumination device according to claim 1, wherein light emitting diode (LED) is arranged to emit blue light as LED light and wherein the luminescent material layer comprises one or more of (a) yellow light emitting luminescent material and optionally a red light emitting luminescent material and (b) a green light emitting luminescent material and a red light emitting luminescent material.

7. The illumination device according to any one of the preceding claim 1, further comprising a sensor arranged to sense one or more optical properties from the illumination device light and arranged to provide a corresponding sensor signal, and wherein the controller is further arranged to control electrically variable scattering element in response to the sensor signal.

8. The illumination device according to claim 1 comprising a plurality of electrically variable scattering elements.

9. The illumination device according to claim 8, comprising a plurality of light chamber, comprising a plurality of electrically variable scattering elements and a plurality of luminescent material layers, respectively.

10. The illumination device according to any one of the preceding claim 1, comprising a plurality of luminescent material layers.

11. The illumination device according to claim 10, wherein a first luminescent material layer and a second luminescent material layer emit luminescent material emissions having different colour points.

12. The illumination device according to claim 10 wherein a first electrically variable scattering element is arranged downstream of the first luminescent material layer, and wherein a second electrically variable scattering element is arranged downstream of the second luminescent material layer.

* * * * *